(12) United States Patent
Houston et al.

(10) Patent No.: US 8,379,433 B2
(45) Date of Patent: Feb. 19, 2013

(54) 3T DRAM CELL WITH ADDED CAPACITANCE ON STORAGE NODE

(75) Inventors: Theodore W. Houston, Richardson, TX (US); Makarand R. Kulkarni, Richardson, TX (US); James (Hsu-Hsuan) Lan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 12/882,355

(22) Filed: Sep. 15, 2010

(65) Prior Publication Data

US 2012/0063202 A1 Mar. 15, 2012

(51) Int. Cl.
*G11C 11/24* (2006.01)
(52) U.S. Cl. .................. 365/149; 365/189.14
(58) Field of Classification Search .................. 365/149, 365/189.14; 257/300
See application file for complete search history.

(56) References Cited

U.S. PATENT DOCUMENTS

| | | | | |
|---|---|---|---|---|
| 5,384,498 A * | 1/1995 | Wong | | 326/31 |
| 6,643,160 B2 * | 11/2003 | Hardee | | 365/63 |
| 7,115,935 B2 * | 10/2006 | Tu et al. | | 257/301 |
| 7,466,617 B2 * | 12/2008 | Luk et al. | | 365/222 |
| 7,600,208 B1 * | 10/2009 | Sharma et al. | | 716/120 |

* cited by examiner

*Primary Examiner* — Son Dinh
*Assistant Examiner* — Nam Nguyen
(74) *Attorney, Agent, or Firm* — Rose Alyssa Keagy; Wade J. Brady III; Frederick J. Telecky, Jr.

(57) ABSTRACT

A 3T DRAM cell includes a first transistor having a first control element connected as a storage node and a second transistor connected between the first transistor and a read bit line having a second control element connected to a read word line. The 3T DRAM cell also includes a third transistor connected between the storage node and a write bit line having a third control element connected to a write word line. Additionally, the DRAM cell includes a supplemental capacitance connected to the storage node and configured to extend a refresh interval of the 3T DRAM cell. A method of operating an integrated circuit having a 3T DRAM cell includes providing a memory state on a storage node of the 3T DRAM cell and extending a refresh interval of the memory state with a supplemental capacitance added to the storage node.

17 Claims, 12 Drawing Sheets

3T DRAM CELL WITH ADDED CAPACITANCE ON STORAGE NODE

TECHNICAL FIELD

The present disclosure is directed, in general, to semiconductor memory and, more specifically, to an integrated circuit including a three transistor dynamic random access memory (3T DRAM) cell and a method of operating an integrated circuit including a 3T DRAM cell.

BACKGROUND

A typical computer memory is designed to store many thousands of bits of information. These bits are stored in individual memory cells that are generally organized in rows and columns to make efficient use of space on a semiconductor substrate containing the memory. A commonly used cell architecture is the six transistor static random access memory (6T SRAM) cell. As computer memory has increased in the number of bits needed, effort has been placed on reducing the size of an individual memory cell. In particular, dynamic random access memory (DRAM) cells having fewer than six transistors are of increasing interest. However, each DRAM cell requires periodic refreshing of its memory state. Although this refresh rate has been adequate in the past, further improvements in the refresh interval would be beneficial in the art.

SUMMARY

Embodiments of the present disclosure provide an integrated circuit including a three transistor dynamic random access memory (3T DRAM) cell and a method of operating an integrated circuit including a 3T DRAM cell.

In one embodiment, the 3T DRAM cell includes a first transistor having a first control element connected as a storage node and a second transistor connected between the first transistor and a read bit line having a second control element connected to a read word line. The 3T DRAM cell also includes a third transistor connected between the storage node and a write bit line having a third control element connected to a write word line. Additionally, the 3T DRAM cell includes a supplemental capacitance connected to the storage node and configured to extend a refresh interval of the 3T DRAM cell.

In another aspect, the method of operating an integrated circuit including a three transistor dynamic random access memory (3T DRAM) cell includes writing a memory state on a storage node of the 3T DRAM cell employing a write bit line controlled by a write word line and reading the memory state on the storage node employing a read bit line controlled by a read word line. The method also includes extending a refresh interval of the memory state with a supplemental capacitance added to the storage node.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 1A:
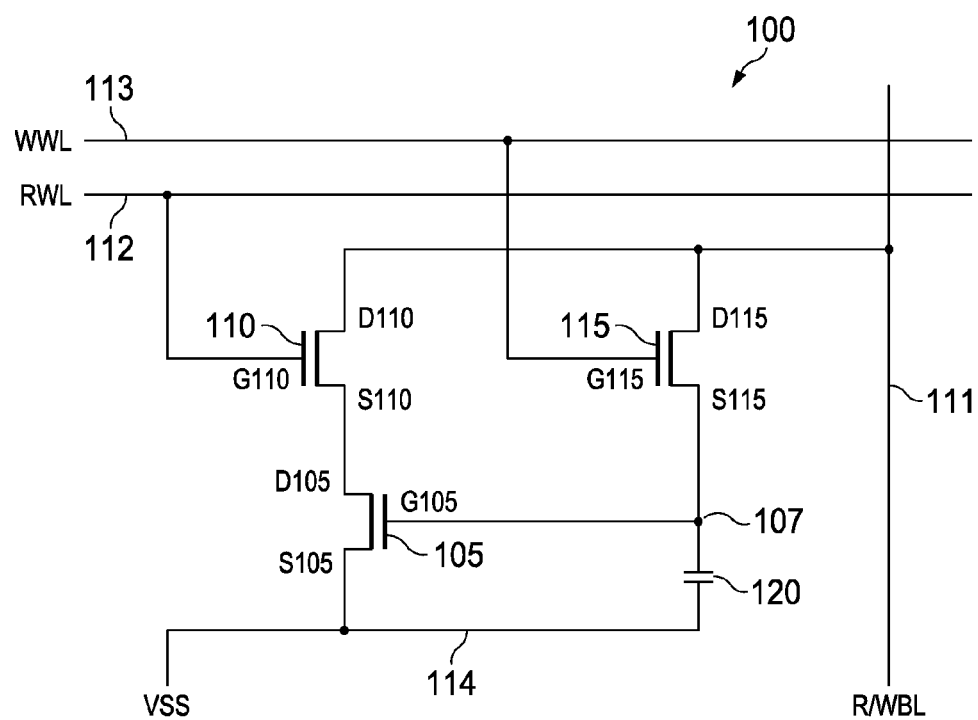
FIGS. 1A and 1B illustrate embodiments of three transistor dynamic random access memory (3T DRAM) cells employing a common bit line and constructed according to the principles of the present disclosure.

With scaling, a standard six transistor static random access memory (6T SRAM) cell becomes less attractive due to tradeoffs corresponding to SNM, Vtrip, Iread, IDDQ, and cell area. Embedded dynamic random access memory (DRAM) is an alternative, but the process cost and lower performance of a one-transistor (1T) DRAM cell are not attractive. A three-transistor (3T) DRAM cell is potentially attractive, but retention time is typically an issue due to gate leakage currents for scaled technology.

Embodiments of the present disclosure add capacitance to the storage node of the 3T DRAM cell in a cost effective manner. One option is to add capacitance employing an addition of a one-mask process adder. Not needing as much capacitance as the 1T DRAM cell, this process adder may be cheaper than the process required for the 1T DRAM cell. Additionally, the 3T DRAM cell provides an advantage of read current versus charge sharing for sensing. Other options include increasing the parasitic capacitance on the storage node without employing a process adder.

For example, a first metallization level M1 (metal 1) above the storage node may be made larger than necessary for interconnect to provide an increased capacitance on the storage node. It may be noted that metallization levels, as discussed in this disclosure, are examples of general interconnect levels as may be employed within the 3T DRAM cell. A current sinking voltage VSS routed in metal 1 may be routed next to the storage node in metal 1 to increase capacitance, although an increase in cell area may occur. Additionally, word and bit lines may be moved up in the metallization levels above the storage node to allow increased capacitance effects that are associated with a second or third metallization level M2, M3 (metal 2 or metal 3) on the storage node.

With a possible increase in cell area, the storage node may be brought up through the word and bit lines to connect to the storage node interleaved with a VSS routing (or current sourcing voltage VDD routing, where appropriate) in a fourth metallization level M4 (metal 4) or above. By bringing the storage node above the word and bit line levels, a full cell area may be used for an added capacitance structure in higher interconnect levels. Also, in a typical interconnect system the upper levels may employ insulation or insulators having an increased dielectric constant. For example, if an increased dielectric constant is used above the fifth metallization level M5 (metal 5), the parasitic fringing capacitance will be increased for adjacent lines in metal 5.

There typically is more room to move the storage node upward if the 3T DRAM cell uses a common read/write bit line (R/WBL) versus separate read and write bit lines. Also, with one dimension of the cell increased to allow the storage node to be brought up between word lines, it may be possible to reduce cell dimensions in the other direction (e.g., by off-setting some gate lengths or ends). Embodiments of the present disclosure are discussed below as examples representative of at least a portion of these concepts for illustration.

Figure 1B:
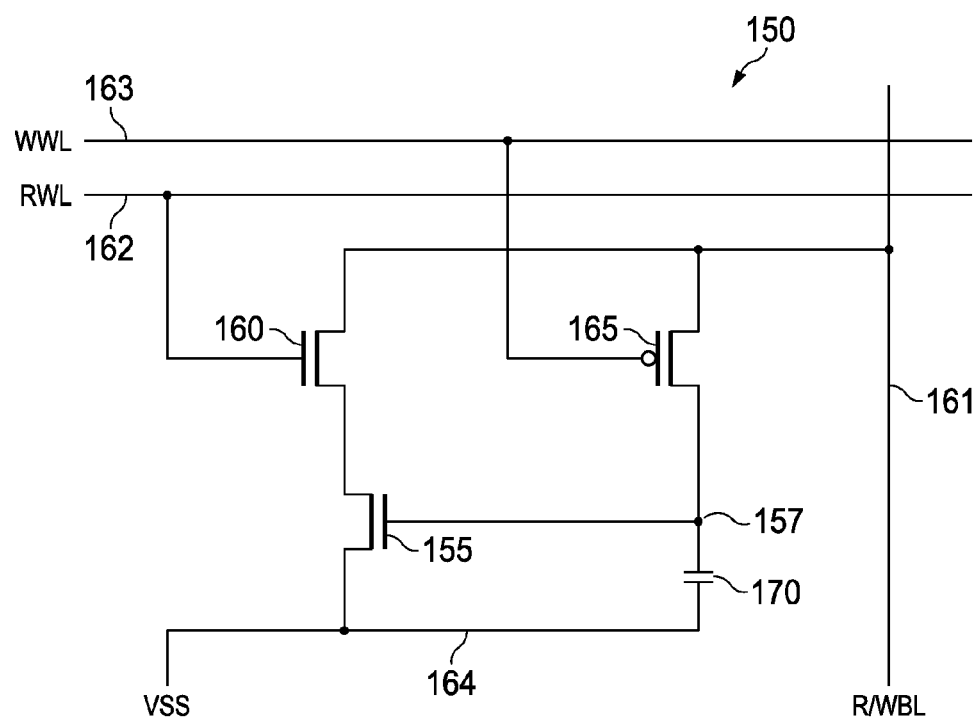

FIGS. 1A and 1B illustrate embodiments of three transistor dynamic random access memory (3T DRAM) cells generally designated 100 and 150 and constructed according to the principles of the present disclosure. The 3T DRAM cells 100 and 150 employ a common read/write bit line (R/WBL) having a read word line (RWL) and a write word line (WWL) structure, as shown. Generally, the 3T DRAM cells 100 and 150 may be included in an embedded memory connected to other portions of an integrated circuit. Alternatively, the 3T DRAM cells 100 and 150 may be included in a discrete memory contained in the integrated circuit.

The 3T DRAM cell 100 includes first and second transistors 105, 110 that are series-connected between a current sinking voltage (VSS) 114 and a R/WBL 111, as shown. The first transistor 105 employs a gate G105 as a first control element connected to a storage node 107. The first transistor 105 also employs a source S105 connected to the VSS 114, and a drain D105 series-connected to a source S110 of the second transistor 110. A drain D110 of the second transistor 110 is connected to the R/WBL 111, and a gate G110 is employed as a second control element connected to a RWL 112.

A third transistor 115 is connected between the storage node 107 and the R/WBL 111 employing a source S115 and provides a gate G115 as a third control element connected to a WWL 113. A drain D115 of the third transistor 115 is employed to connect to the R/WBL 111, as shown. A supplemental capacitance 120 is connected between the storage node 107 and the VSS 114 to extend a retention time of the 3T DRAM cell 100.

During a read operation, the R/WBL 111 is typically pre-charged to provide a pre-charge read voltage. When the read word line RWL 112 activates the second transistor 110 for the read operation, and the charge on the supplemental capacitance 120 provides sufficient voltage on the storage node 107 to activate the first transistor 105, the R/WBL 111 is pulled toward the VSS 114 representing one of two logic states for the 3T DRAM cell 100. Alternatively, if the voltage on the storage node 107 is not sufficient to activate the first transistor 105, activation of the second transistor 110 will not affect the pre-charge read voltage on the R/WBL 111. This provides the other logic state reading for the 3T DRAM cell 100.

Analogously, during a write operation, a write voltage corresponding to a desired logic state for the 3T DRAM cell 100 is placed on the R/WBL 111. When the write word line WWL 113 activates the third transistor 115 for the write operation, the write voltage corresponding to the desired logic state on the R/WBL 111 is transferred to the supplemental capacitance 120 thereby adjusting the storage node 107 to the desired logic state for the 3T DRAM cell 100. This logic state is maintained through refresh cycles until a new write operation is initiated. The value of the supplemental capacitance 120 determines a retention time (maximum refresh period) required to maintain a stored logic state for the 3T DRAM cell 100.

Table 1 provides three examples of retention times based on supplemental capacitances. Case 1 is a baseline example wherein no supplemental capacitance is intentionally added. Case 2 increases supplemental capacitance up to metal 2, and Case 3 increases supplemental capacitance up to metal 5. Case 2 provides a retention time improvement of about 24 percent, and Case 3 increases the retention time improvement to about 129 percent over Case 1.

TABLE 1

| Cases | Extracted Wire Capacitance (fF) | Retention Time (microseconds) | Improvement in Retention Time Over Case 1 |
|---|---|---|---|
| 1. No capacitance intentionally added | 0.18 | 4.9 | |
| 2. Increased Capacitance up to metal M2 | 0.27 | 6.1 | 24% |
| 3. Increased Capacitance up to metal M5 | 0.63 | 11.2 | 129% |

In FIG. 1B, the 3T DRAM cell 150 includes first and second transistors 155, 160 that are series-connected between a current sinking voltage (VSS) 164 and a R/WBL 161, as shown. The first transistor 155 employs a gate as a first control element connected to a storage node 157. The first transistor 155 also employs a source connected to the VSS 164, and a drain series-connected to a source of the second transistor 160. A drain of the second transistor 160 is connected to the R/WBL 161, and a gate is employed as a second control element connected to a RWL 162.

A third transistor 165 is connected between the storage node 157 and the R/WBL 161 employing a source and provides a gate as a third control element connected to a WWL 163. A drain of the third transistor 165 is also connected to the R/WBL 161, as shown. A supplemental capacitance 170 is connected between the storage node 157 and the VSS 164 to extend a retention time of the 3T DRAM cell 150.

In this embodiment, the first and second transistors 155, 160 are of the same polarity, and the third transistor 165 is of an opposite polarity, as shown. This embodiment requires that an activation signal on the WWL 163 be of an opposite sense from the activation signal on the WWL 113 for the 3T DRAM cell 100 discussed with respect to FIG. 1A. Otherwise, operation of the 3T DRAM cell 150 mirrors the operation of the 3T DRAM cell 100.

Figure 2:
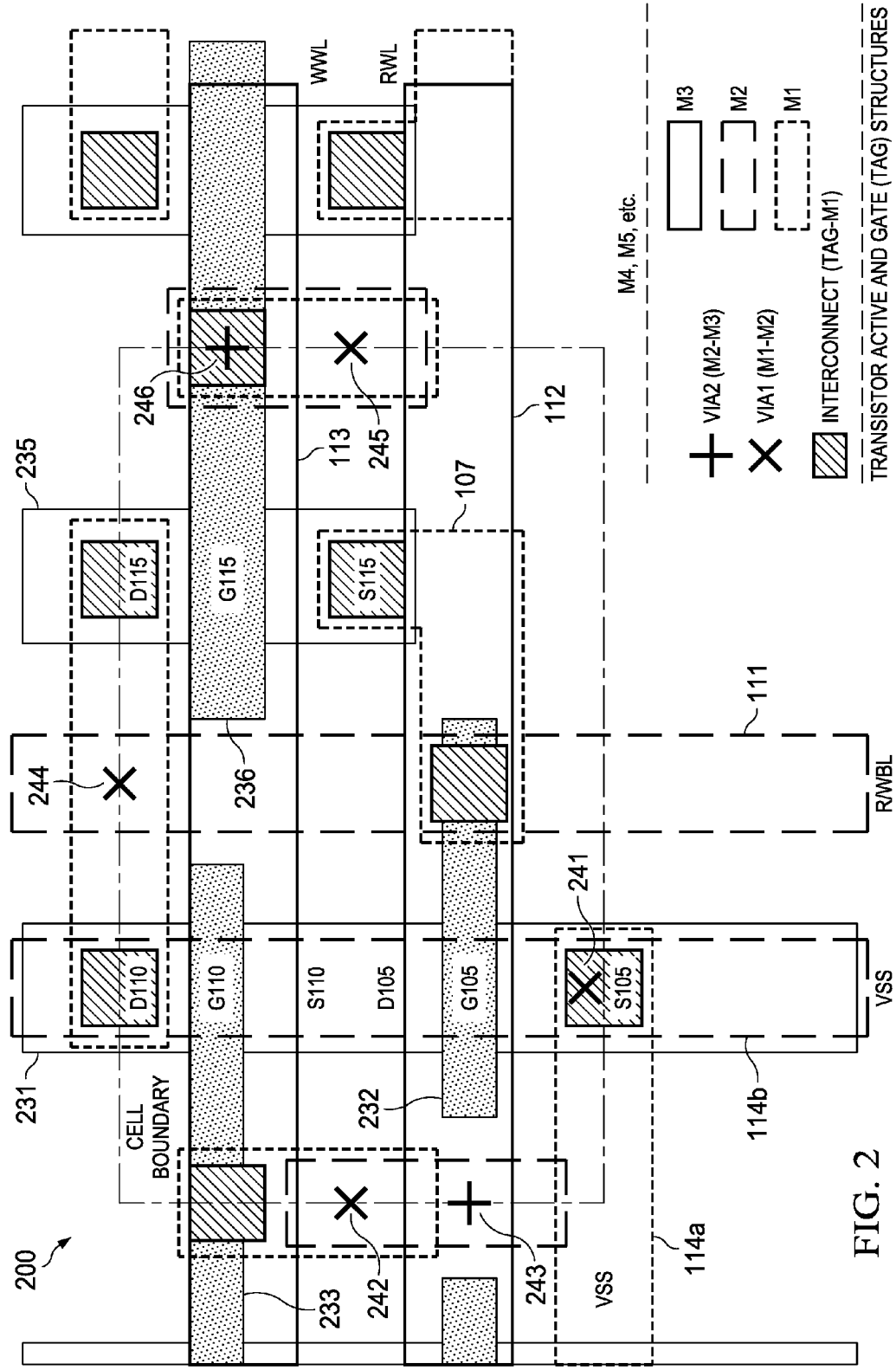
FIG. 2 illustrates a physical layout diagram corresponding to a basic 3T DRAM cell such as that employed in the 3T DRAM cell of FIG. 1A without the supplemental capacitance.

FIG. 2 illustrates a physical layout diagram corresponding to a basic 3T DRAM cell 200 such as that employed in the 3T DRAM cell 100 without the supplemental capacitance 120. The basic 3T DRAM cell 200 may be used as a basic structure for illustrating supplemental capacitance examples constructed according to the principles of the present disclosure. The physical layout diagram of FIG. 2 employs a p-type substrate and, for clarity, focuses only on transistor active and gate structures. Layout of a common read/write bit line, read and write word lines and power supply lines may follow standard procedures familiar to one skilled in the pertinent art.

The FIG. 2 illustrates transistor active and gate structures along with first, second and third metallization levels M1, M2, M3 (metal 1, metal 2 and metal 3) located above the transistor active and gate structures. Interconnects (or interconnections) provide connection to metal 1 from the transistor active and gate structures. First level vias (VIA1s) provide connection between metal 1 and metal 2, and second level vias (VIA2s) provide connection between metal 2 and metal 3.

First and second transistors 105, 110 are provided in a first transistor active structure 231 further employing first and second gate structures 232, 233, as shown. The third transistor 115 is provided in a second transistor active structure 235 further employing a third gate structure 236. The storage node 107 is provided as a metal 1 pattern connecting the gate G105 and the source S115 employing two interconnects. The VSS 114 is provided as a metal 1 pattern 114a interconnected to the source S105 that is further connected to a metal 2 pattern 114b employing a VIA1 241.

The gate G110 is interconnected to a metal 1 pattern that is connected to a metal 2 pattern employing a VIA1 242, which in turn, is further connected to the RWL 112 in metal 3 employing a VIA2 243. Similarly, the gate G115 is interconnected to another metal 1 pattern that is connected to another metal 2 pattern employing a VIA1 245, which is further connected to the WWL 113 in metal 3 employing a VIA2 246. The drains D110, D115 are interconnected to yet another metal 1 pattern that is connected to the R/WBL 111 in metal 2 employing a VIA1 244. The example of FIG. 2, corresponding to the basic 3T DRAM cell 200 without the supplemental capacitance 120, may be used as a basic structure for illustrating supplemental capacitance embodiments employing a single read/write bit line.

These supplemental capacitance embodiments, as discussed below, provide examples constructed according to the principles of the present disclosure. Generally, at least a portion of the supplemental capacitance may be supplied by an intrinsic metallization level inherent in a 3T DRAM cell, which corresponds to metals 1, 2 and 3 for these discussions. Additionally, at least a portion of the supplemental capacitance may be supplied by an extrinsic metallization level added to the 3T DRAM cell, such as metal 4 and above. Extrinsic metallization levels may employ substantially a full footprint of the 3T DRAM cell to provide supplemental capacitance.

Supplemental capacitance may be provided by manipulation of the layout of layers that are inherent in the construction of the 3T cell, including the gate level and levels required to connect the nodes of the cell. Supplemental capacitance may be provided by an overlap capacitance between two metallization levels wherein the overlap capacitance corresponds to an overlapping area between metallization levels that are insulated from one another. Alternatively, supplemental capacitance may be provided by an edge capacitance in at least one metallization level wherein the edge capacitance typically corresponds to metallization patterns having proximate edges that are insulated from one another. Of course, metallization patterns in several levels having proximate edges may also provide an edge capacitance contribution to supplemental capacitance. Generally, an increase in supplemental capacitance may also occur from an intended addition or size increase in these metallization patterns.

Additionally, supplemental capacitance may be provided by a metal-insulator-metal (MIM) capacitor. For example, the MIM capacitor may be constructed in a metallization level employing poly insulation, or a high-dielectric coefficient insulator may be provided to enhance supplemental capacitance for a given MIM capacitor footprint.

Figure 3:
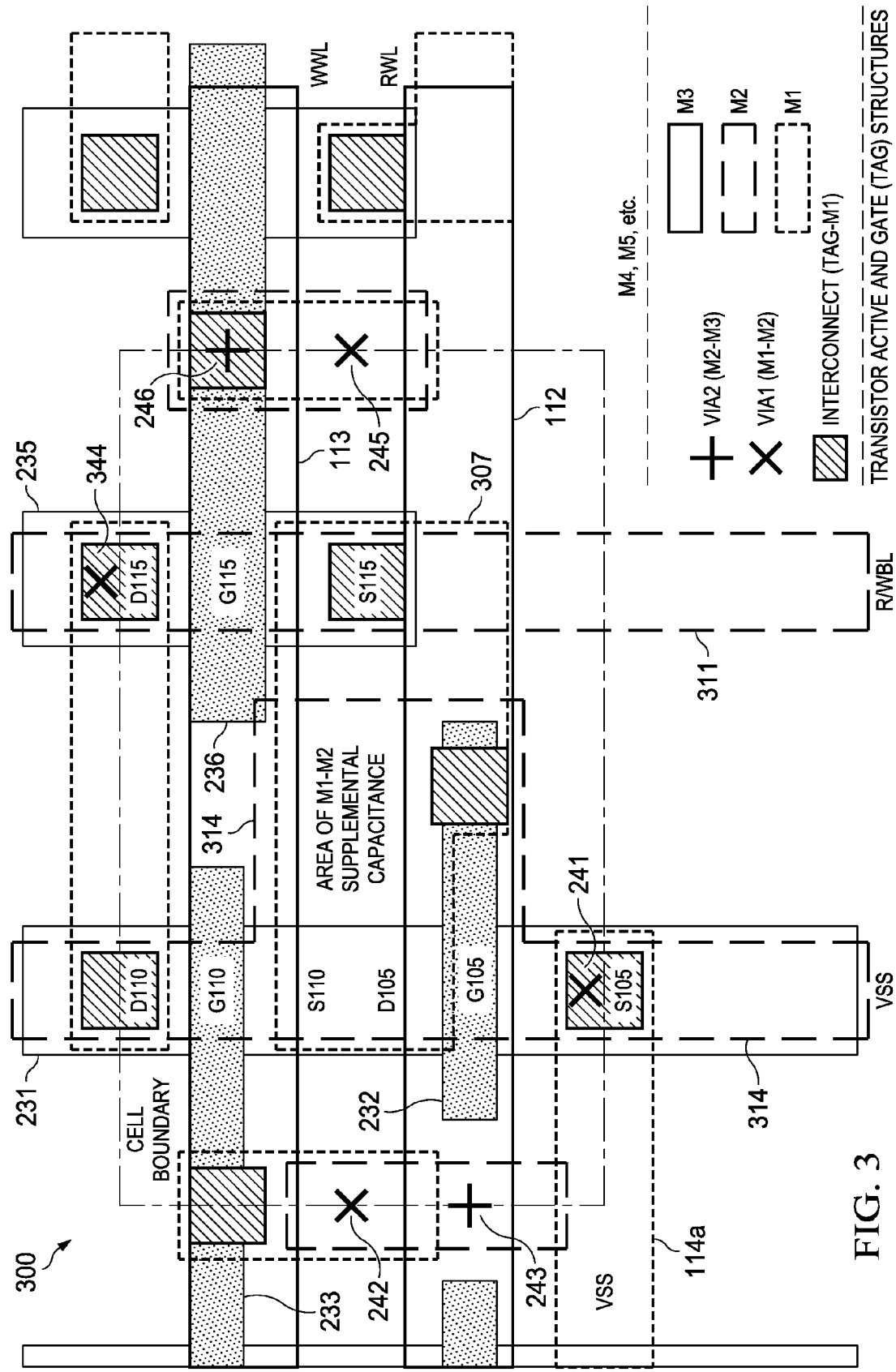
FIG. 3 illustrates an example of a physical layout diagram that shows supplemental capacitance constructed according to the principles of the present disclosure.

FIG. 3 illustrates an example of a physical layout diagram 300 that shows supplemental capacitance constructed according to the principles of the present disclosure. The physical layout diagram 300 employs the physical layout diagram of FIG. 2 as a basic structure wherein the R/WBL 111 of FIGURE is relocated to a R/WBL 311, as shown. The VIA1 244 is correspondingly relocated to a VIA1 344 to functionally connect the R/WBL 311, as before. The storage node 107 is enlarged in metal 1 as a storage node 307. Correspondingly, a VSS 314 is elongated in metal 2 over a portion of the enlarged storage node 307 to provide an overlap capacitance for added M1-M2 supplemental capacitance corresponding to the supplemental capacitance 120 of FIG. 1A.

Figure 4:
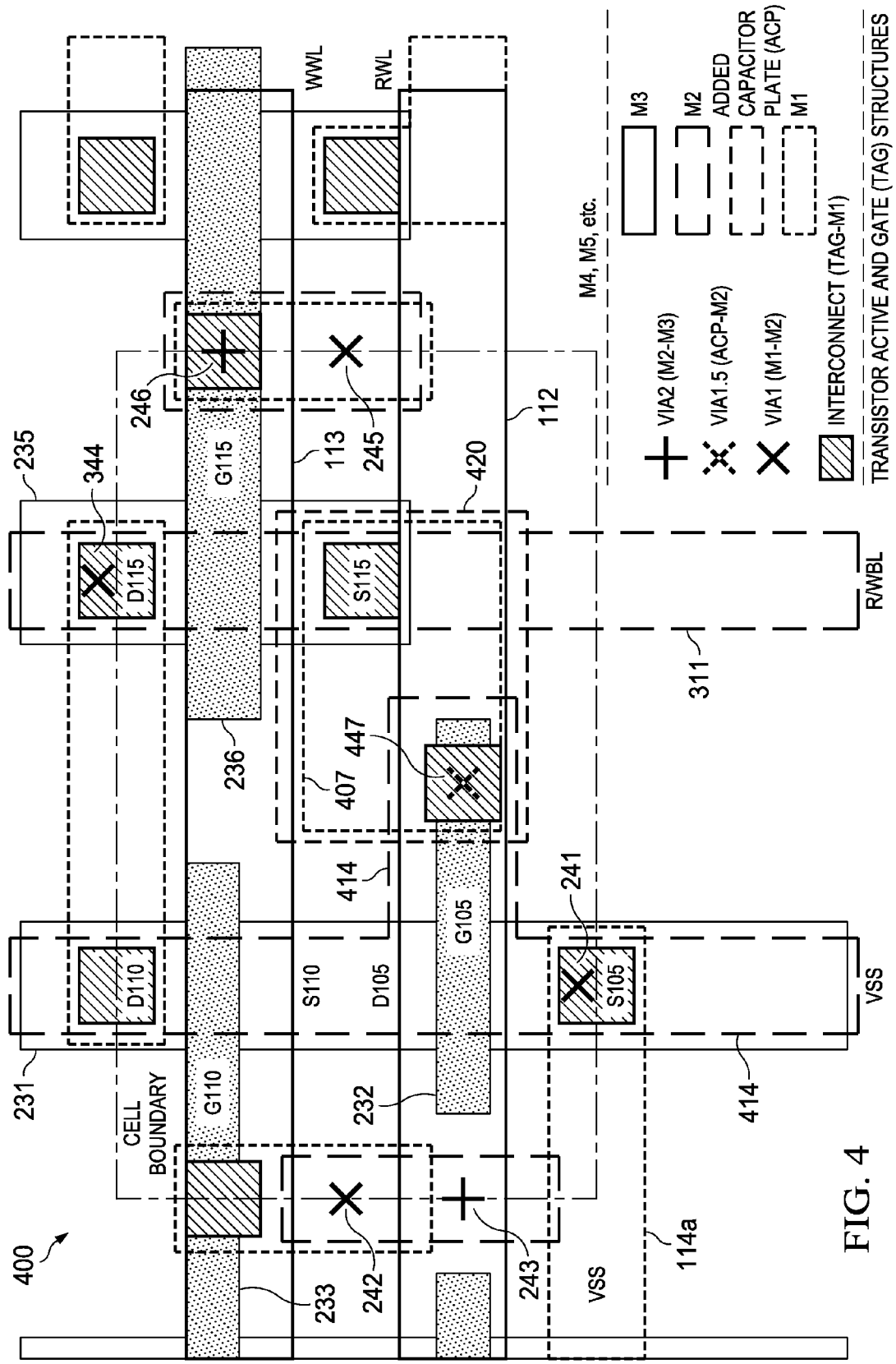
FIG. 4 illustrates another example of a physical layout diagram that shows supplemental capacitance constructed according to the principles of the present disclosure.

FIG. 4 illustrates another example of a physical layout diagram 400 that shows supplemental capacitance constructed according to the principles of the present disclosure. The physical layout diagram 400 also employs the basic 3T DRAM cell 200 as a basic structure wherein the R/WBL 111 of FIG. 2 is relocated to the R/WBL 311 along with the VIA1 344 to functionally connect the R/WBL 311 as before. Again, the storage node 107 is enlarged in metal 1 as a storage node 407. Correspondingly, a VSS 414 is elongated in metal 2 to provide a contact area for connecting an added capacitor plate (ACP) 420 employing a VIA1.5, which connects the VSS 414 to the ACP 420.

A portion of the enlarged storage node 407 and the ACP 420 form a metal-insulator-metal (MIM) capacitor between the storage node 407 and the VSS 414, which serves as a supplemental capacitance 120. A capacitance value for the MIM capacitor may be tailored by selection of a dielectric constant of the insulator. In one embodiment, the capacitance value is enhanced by selecting a high dielectric constant insulator employing a high-k insulating material.

Figure 5:
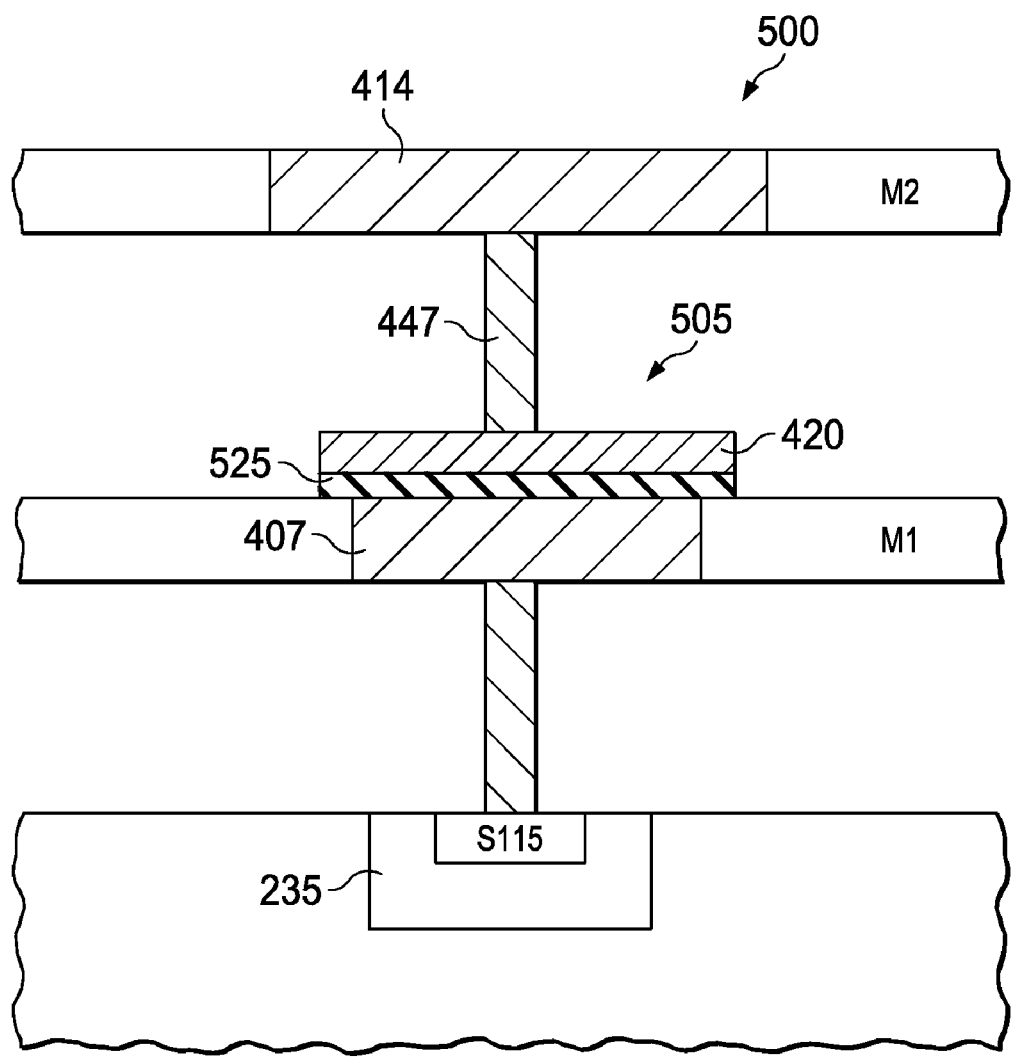
FIG. 5 illustrates a physical layout structure including an example of a metal-insulator-metal (MIM) capacitor as may be employed in the embodiment of FIG. 4.

FIG. 5 illustrates a physical layout structure 500 including an example of a metal-insulator-metal (MIM) capacitor as may be employed in the embodiment of FIG. 4. The physical layout structure 500 includes an MIM capacitor 505 having the added capacitor plate (ACP) 420 provided over the extended storage node 407, which is constructed in metal 1 (M1). The ACP 420 is connected to the VSS 414 constructed in metal 2 (M2) employing the VIA1.5 447. The extended storage node 407 is connected to the source S115 formed in the transistor active region 235 employing an interconnection to metal 1, as shown. An insulator 525 is provided between the ACP 420 and the extended storage node 407.

Figure 6:
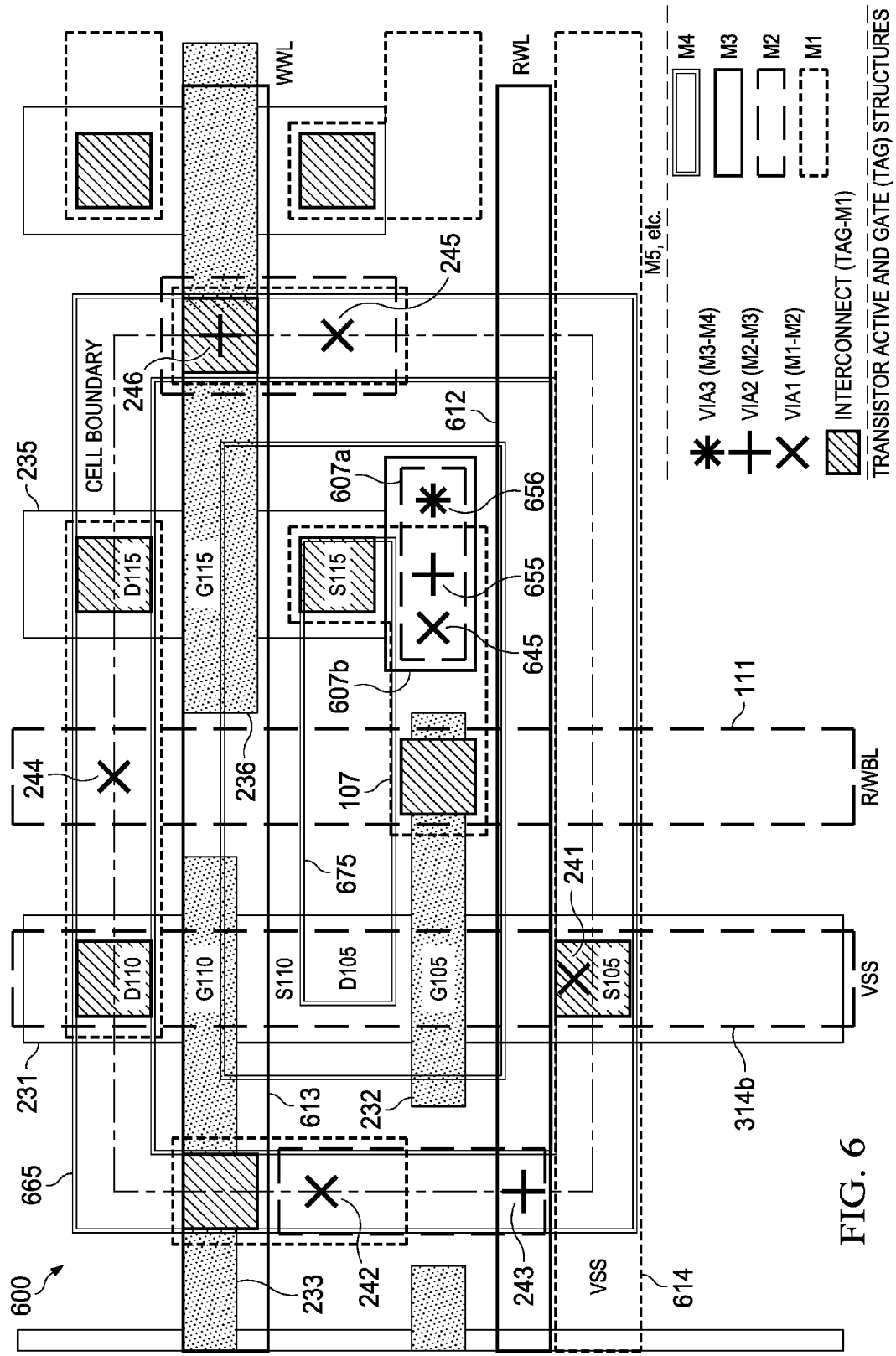
FIG. 6 illustrates another example of a physical layout diagram that shows supplemental capacitance constructed according to the principles of the present disclosure.

FIG. 6 illustrates another example of a physical layout diagram 600 that shows supplemental capacitance constructed according to the principles of the present disclosure. The physical layout diagram 600 also employs the physical layout diagram of FIG. 2 as a basic structure wherein a RWL 612 and a WWL 613 have an increased separation compared to the RWL 112 and the WWL 113 of FIG. 2 to provide a space for extending the storage node 107. Also, a VSS 614 extends the VSS 114a of FIG. 2 in metal 1 along its adjacent cell boundary to provide an increased edge capacitance.

The storage node 107 is extended by a VIA1 645 to provide an extended storage node 607a in metal 2, which is further extended by a VIA2 655 to provide another extended storage node 607b in metal 3. Metal 3 is the highest intrinsic metallization level inherent in the basic 3T DRAM cell 200 of FIG. 2. These extensions allow additional VSS and storage node patterns to be provided by extrinsic metallization levels added to the basic 3T DRAM cell. A metal 4 pattern 665, which is connected to VSS 614 (not explicitly shown), and a metal 4 pattern 675, which is connected to the storage node by a VIA5 656, employ substantially a full footprint of the basic 3T DRAM cell 200, as shown. The edge capacitance between VSS and the storage node on metal 4 adds substantially to the supplemental capacitance 120. Of course, extensions to metal 5 and above may also be accommodated to enhance a value of the supplemental capacitance 120. Removal of the VSS 314b may also be accommodated if additional space is required for other routing in metal 2.

Figure 7A:
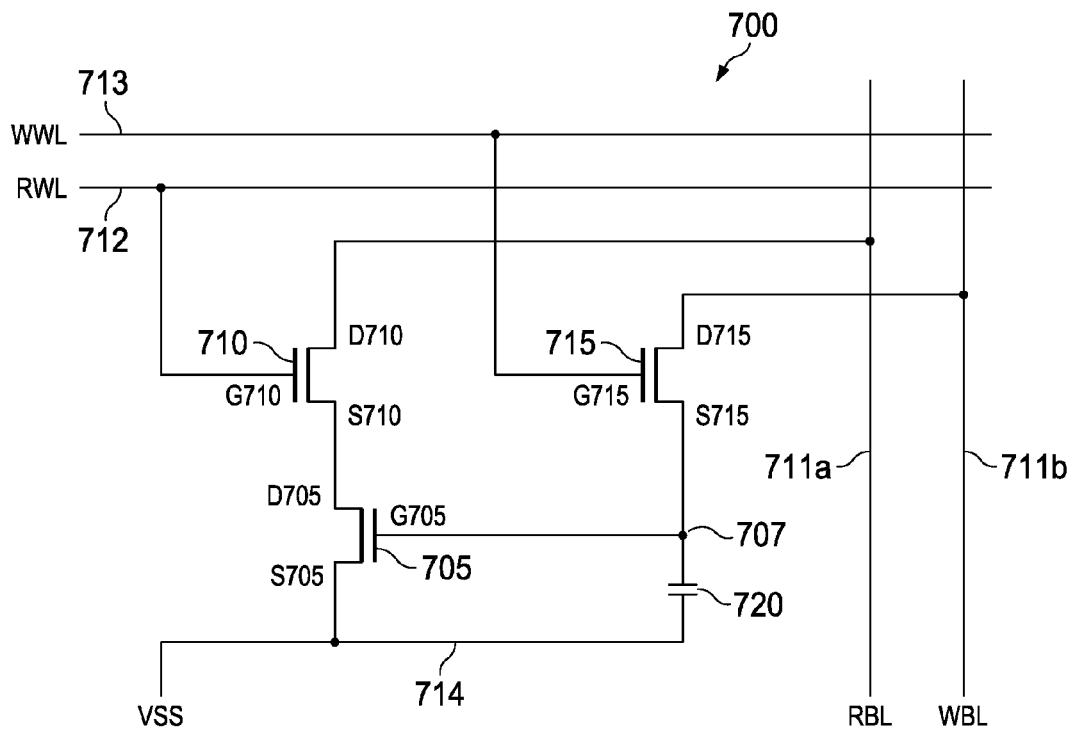
FIGS. 7A and 7B illustrate additional embodiments of 3T DRAM cells employing two bit lines and constructed according to the principles of the present disclosure.
Figure 7B:
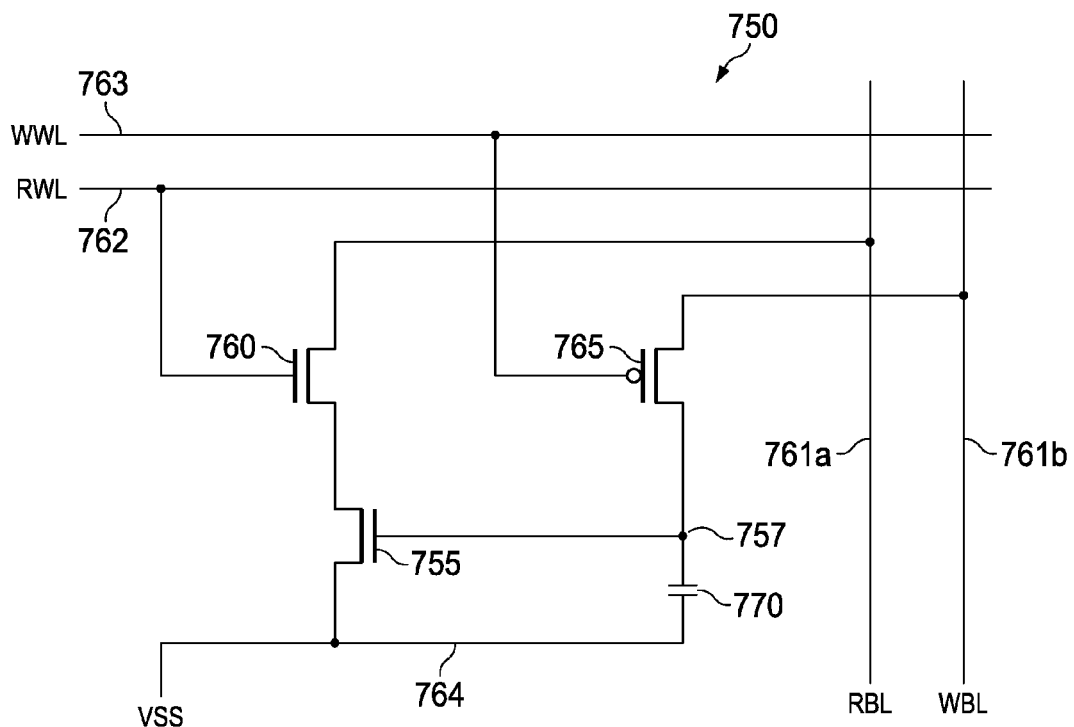

FIGS. 7A and 7B illustrate additional embodiments of 3T DRAM cells generally designated 700 and 750 and constructed according to the principles of the present disclosure. The 3T DRAM cells 700 and 750 employ a read bit line (RBL) and a write bit line (WBL) having a read word line (RWL) and a write word line (WWL) structure, as shown. As before, the 3T DRAM cells 700 and 750 may be included in an embedded memory connected to other portions of an integrated circuit. Alternatively, the 3T DRAM cells 700 and 750 may be included in a discrete memory contained in the integrated circuit.

The 3T DRAM cell 700 includes first and second transistors 705, 710 that are series-connected between a current sinking voltage (VSS) 714 and a RBL 711a, as shown. The first transistor 705 employs a gate G705 as a first control element connected to a storage node 707. The first transistor 705 also employs a source S705 connected to the VSS 714, and a drain D705 series-connected to a source S710 of the second transistor 710. A drain D710 of the second transistor 710 is connected to the RBL 711a, and a gate G710 is employed as a second control element connected to a RWL 712.

A third transistor 715 is connected between the storage node 707 and a WBL 711b employing a source S715 and provides a gate G715 as a third control element connected to a WWL 713. A drain D715 of the third transistor 715 is employed to connect to the WBL 711b, as shown. A supplemental capacitance 720 is connected between the storage node 707 and the VSS 714 to extend a retention time of the 3T DRAM cell 700.

During a read operation, the RBL 711a is typically pre-charged to provide a pre-charge read voltage. When the RWL 712 activates the second transistor 710 for the read operation, and the charge on the supplemental capacitance 720 provides sufficient voltage on the storage node 707 to activate the first transistor 705, the RBL 711a is pulled toward the VSS 714 representing one of two logic states for the 3T DRAM cell 700. Alternatively, if the voltage on the storage node 707 is not sufficient to activate the first transistor 705, activation of the second transistor 710 will not affect the pre-charge read voltage on the RBL 711a. This provides the other logic state reading for the 3T DRAM cell 700.

Analogously, during a write operation, a write voltage corresponding to a desired logic state for the 3T DRAM cell 700 is placed on the WBL 711b. When the write word line WWL 713 activates the third transistor 715 for the write operation, the write voltage corresponding to the desired logic state on the WBL 711b is transferred to the supplemental capacitance 720 thereby adjusting the storage node 707 to the desired logic state for the 3T DRAM cell 700. This logic state is maintained through refresh cycles until a new write operation is initiated. The value of the supplemental capacitance 720 determines a retention time (maximum refresh period) required to maintain a stored logic state for the 3T DRAM cell 700.

In FIG. 7B, the 3T DRAM cell 750 includes first and second transistors 755, 760 that are series-connected between a current sinking voltage (VSS) 764 and a RBL 761a, as shown. The first transistor 755 employs a gate as a first control element connected as a storage node 757. The first transistor 705 also employs a source connected to the VSS 764, and a drain series-connected to a source of the second transistor 760. A drain of the second transistor 760 is connected to the RBL 761a, and a gate is employed as a second control element connected to a RWL 762.

A third transistor 765 is connected between the storage node 757 and a WBL 761b employing a source and provides a gate as a third control element connected to a WWL 763. A drain of the third transistor 765 is also connected to the WBL 761b, as shown. A supplemental capacitance 770 is connected between the storage node 757 and the VSS 764 to extend a retention time of the 3T DRAM cell 750.

In this embodiment, the first and second transistors 755, 760 are of the same polarity, and the third transistor 765 is of an opposite polarity, as shown. This embodiment requires that an activation signal on the WWL 763 be of an opposite sense from the activation signal on the WWL 713 for the 3T DRAM cell 700 discussed with respect to FIG. 7A. Otherwise, operation of the 3T DRAM cell 750 mirrors the operation of the 3T DRAM cell 700.

Figure 8:
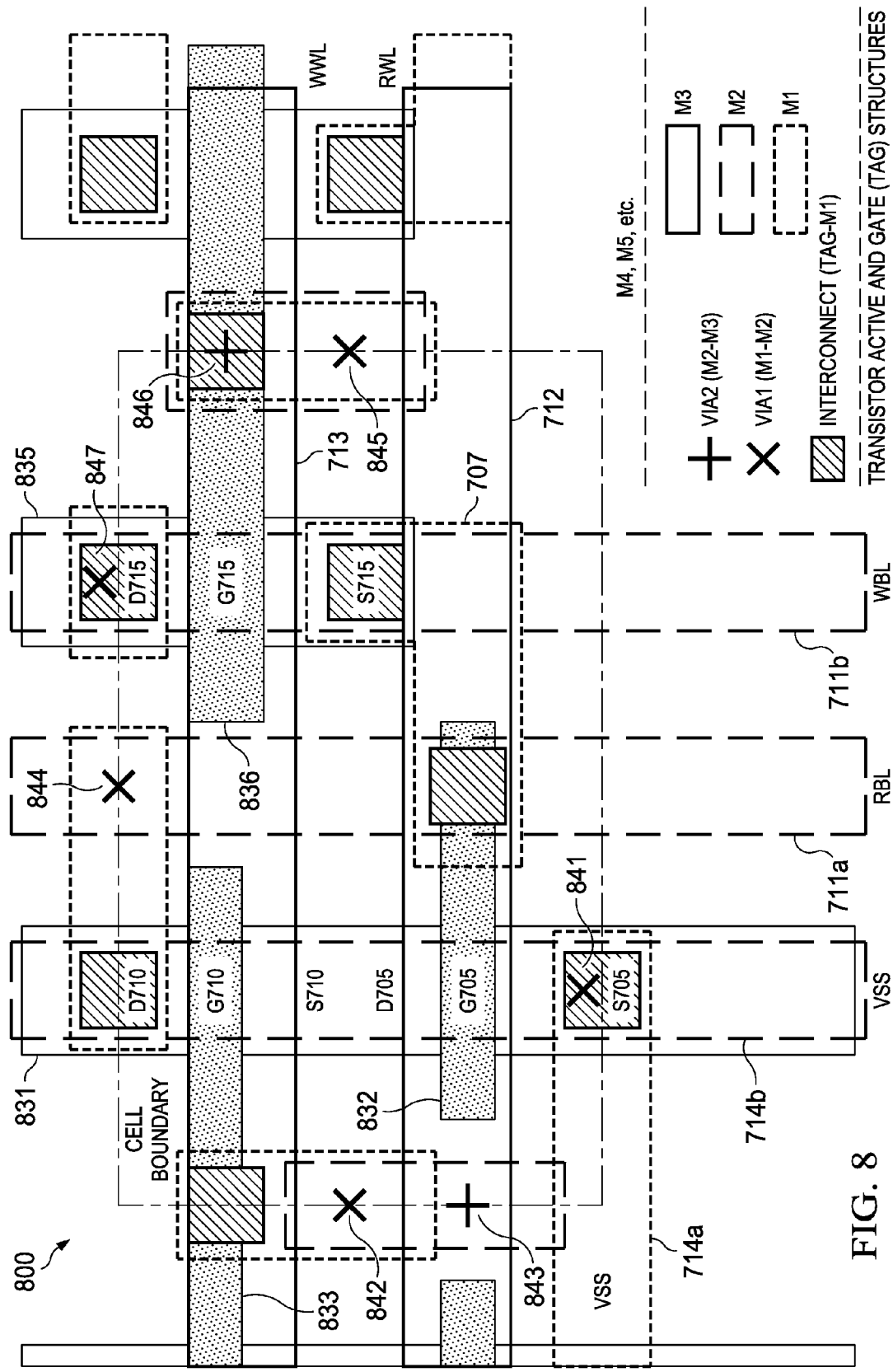
FIG. 8 illustrates a physical layout diagram corresponding to a basic 3T DRAM cell such as that employed in the 3T DRAM cell of FIG. 7A without the supplemental capacitance.

FIG. 8 illustrates a physical layout diagram 800 corresponding to a basic 3T DRAM cell such as that employed in the 3T DRAM cell 700 without the supplemental capacitance 720. The physical layout diagram 800 may be used as a basic structure for a two bit line 3T DRAM cell for illustrating supplemental capacitance examples constructed according to the principles of the present disclosure. As before, the physical layout diagram 800 may employ a p-type substrate and, for clarity, focuses only on transistor active and gate structures. Layout of read and write bit lines, read and write word lines and power supply lines may follow standard procedures familiar to one skilled in the pertinent art.

The physical layout diagram 800 illustrates transistor active and gate structures along with first, second and third metallization levels M1, M2, M3 (metal 1, metal 2 and metal 3) located above the transistor active and gate structures. Interconnects (or interconnections) provide connection to metal 1 from the transistor active and gate structures. First level vias (VIA1s) provide connection between metal 1 and metal 2, and second level vias (VIA2s) provide connection between metal 2 and metal 3.

First and second transistors 705, 710 are provided in a first transistor active structure 831 further employing first and second gate structures 832, 833, as shown. The third transistor 715 is provided in a second transistor active structure 835 further employing a third gate structure 836. The storage node 707 is provided as a metal 1 pattern connecting the gate G705 and the source S715 employing two interconnects. The VSS 714a is provided as a metal 1 pattern interconnected to the source S705 that is further connected to a metal 2 pattern VSS 714b employing a VIA1 841.

The gate G710 is interconnected to a metal 1 pattern employing a VIA1 842 that is connected to a metal 2 pattern, which in turn, is further connected to the RWL 712 in metal 3 employing a VIA2 843. Similarly, the gate G715 is interconnected to another metal 1 pattern that is connected to another metal 2 pattern employing a VIA1 845, which is further connected to the WWL 713 in metal 3 employing a VIA2 846. The drain D710 is interconnected to yet another metal 1 pattern that is further connected to the RBL 711a in metal 2 employing a VIAL 844. The drain D715 is similarly interconnected and further connected to the WBL 711b in metal 2 employing a VIA1 847.

As before, the physical layout diagram 800 example, corresponding to the basic 3T DRAM cell 700 without the supplemental capacitance 720, may be used as a basic structure for illustrating supplemental capacitance embodiments employing separate read and write bit lines.

Figure 9:
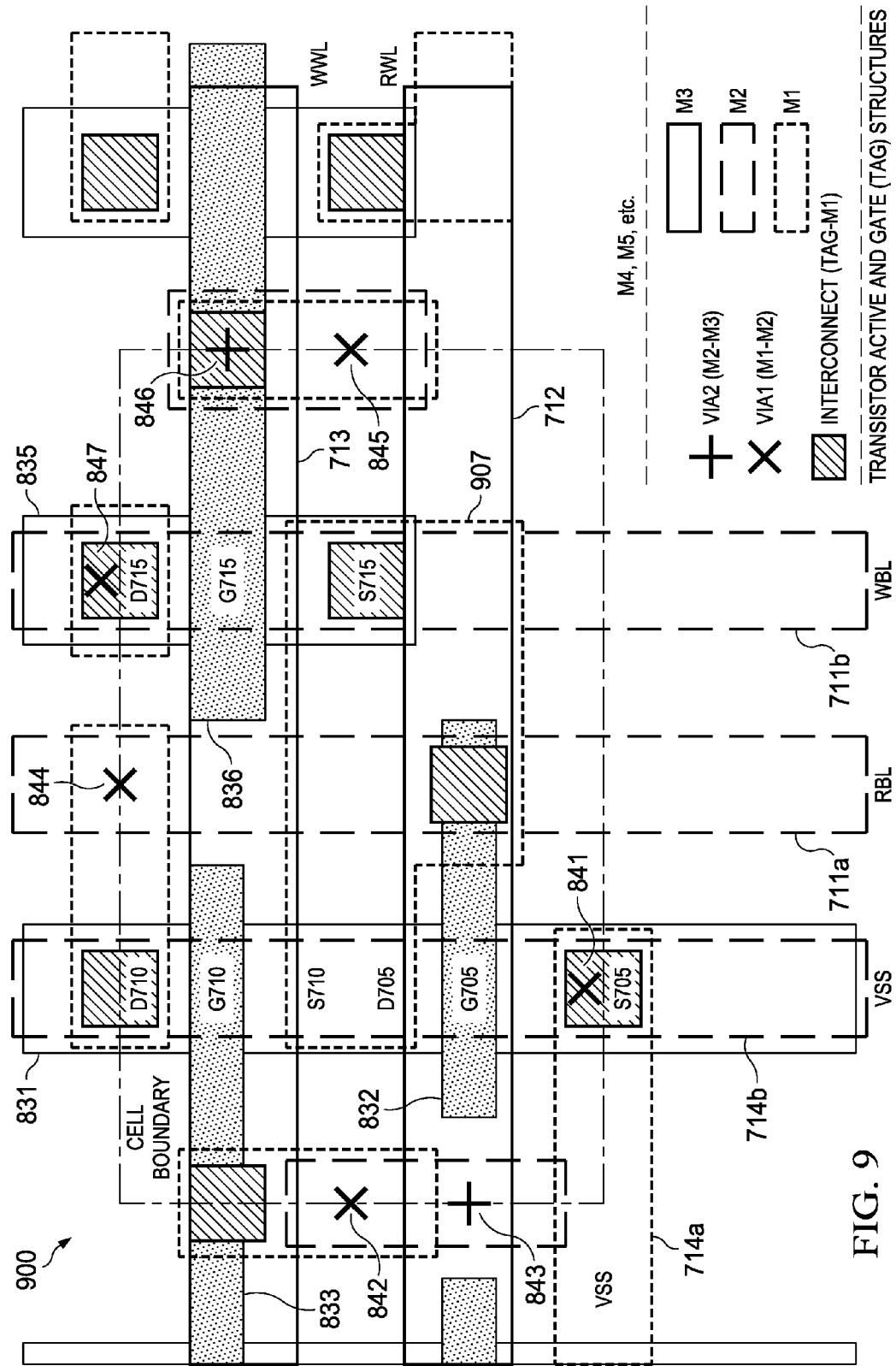
FIG. 9 illustrates an example of a physical layout diagram that shows supplemental capacitance constructed according to the principles of the present disclosure.

FIG. 9 illustrates an example of a physical layout diagram 900 that shows supplemental capacitance constructed according to the principles of the present disclosure. The physical layout diagram 900 employs the physical layout diagram 800 as a basic structure wherein the storage node 707 in metal 1 of FIG. 8 is replaced with a storage node 907 also in metal 1. The storage node 907 has been enlarged and extended to provide an overlapping area with the VSS 714b pattern in metal 2. This overlapping area provides a supplemental capacitance corresponding to the supplemental capacitance 720 of FIG. 7A.

Figure 10:
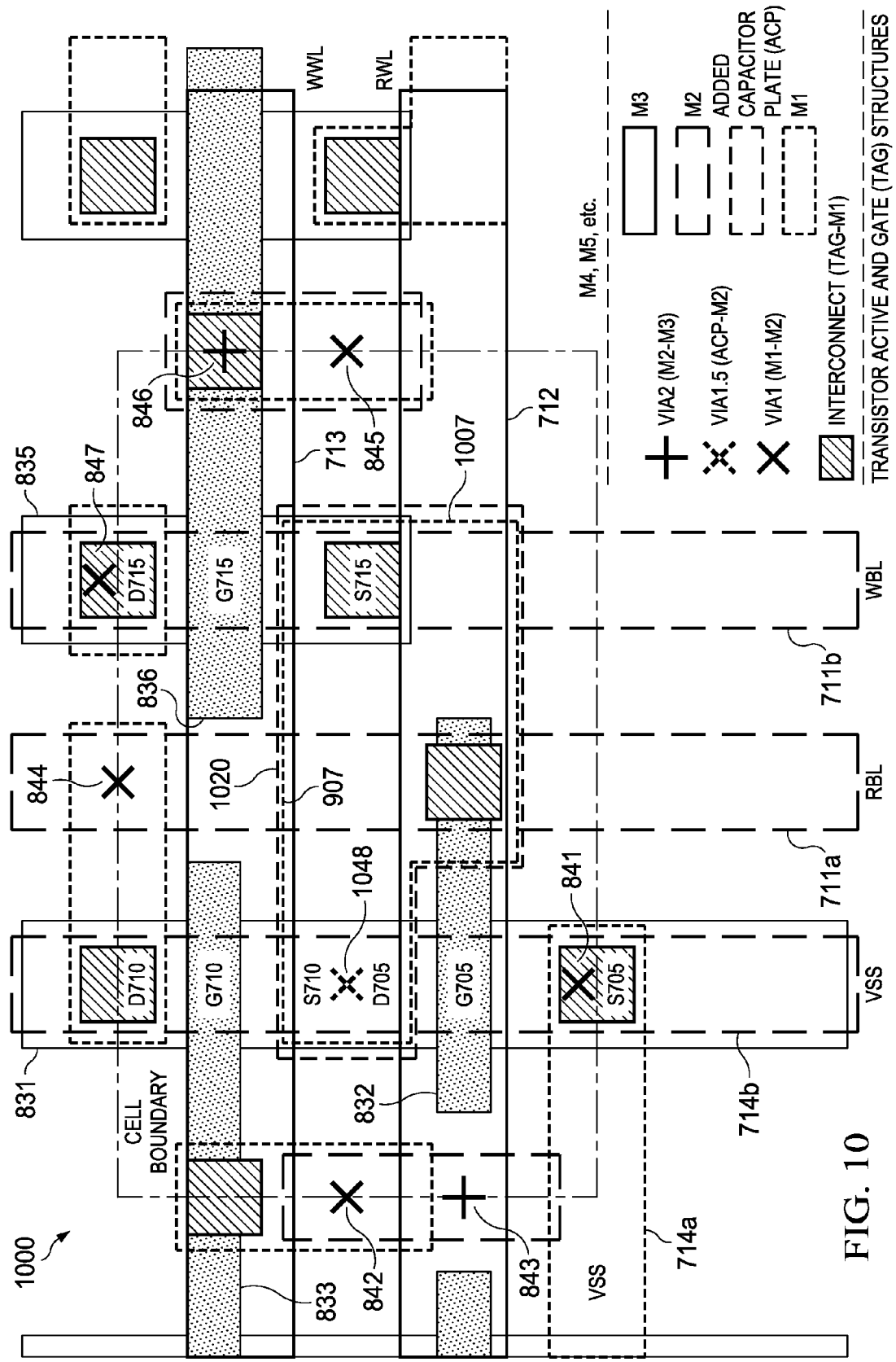
FIG. 10 illustrates another example of a physical layout diagram that shows supplemental capacitance employing an added capacitor plate to form an MIM capacitor constructed according to the principles of the present disclosure.

FIG. 10 illustrates another example of a physical layout diagram 1000 that shows supplemental capacitance employing an added capacitor plate to form an MIM capacitor constructed according to the principles of the present disclosure. The physical layout diagram 1000 also employs the physical layout diagram 800 as a basic structure. Again, the storage node 707 is enlarged in metal 1 as a storage node 1007, and an added capacitor plate (ACP) 1020 is provided to form an MIM capacitor for the supplemental capacitance 720 of FIG. 7A. A VIA1.5 1048 connects the ACP 1020 to the VSS 714b. A capacitance value of the MIM capacitor may be tailored to the requirements of the supplemental capacitance 720 through judicious selection of a dielectric constant for a separating insulator between the storage node 1007 and the ACP 1020. The general discussion provided with respect to FIG. 5, may be applied to the MIM capacitor of FIG. 10.

Figure 11:
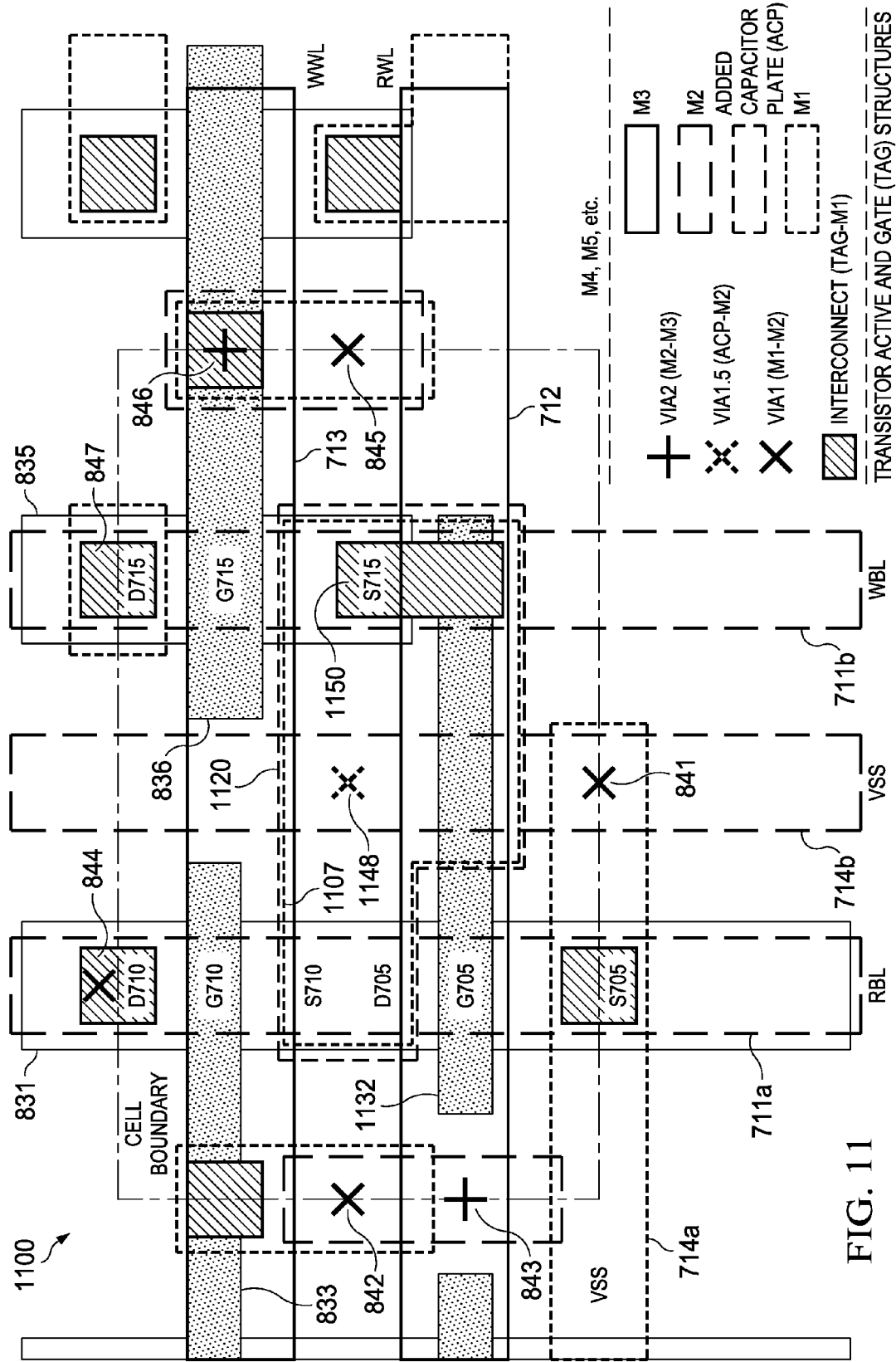
FIG. 11 illustrates a physical layout diagram that shows an alternative construction for an MIM capacitor such as discussed with respect to FIG. 10.

FIG. 11 illustrates a physical layout diagram 1100 that shows an alternative construction for an MIM capacitor such as discussed with respect to FIG. 10. The physical layout diagram 1100 also employs the physical layout diagram 800 wherein the RBL 711a and the VSS 714b have been interchanged. Again, the storage node 707 is enlarged in metal 1 as a storage node 1107, and an added capacitor plate (ACP) 1120 is provided to form an MIM capacitor for the supplemental capacitance 720 of FIG. 7A. A VIA1.5 1148 connects the ACP 1120 to the VSS 714b. Additionally, the gate structure 832 has been extended in a gate structure 1132 such that an interconnection employing a stretch contact 1150 may be employed to connect the source S(715) to the gate G(705) as well as storage node 1107 in metal 1. The previous comments regarding dielectric constant selection and construction of the MIM capacitor are generally applicable.

Figure 12:
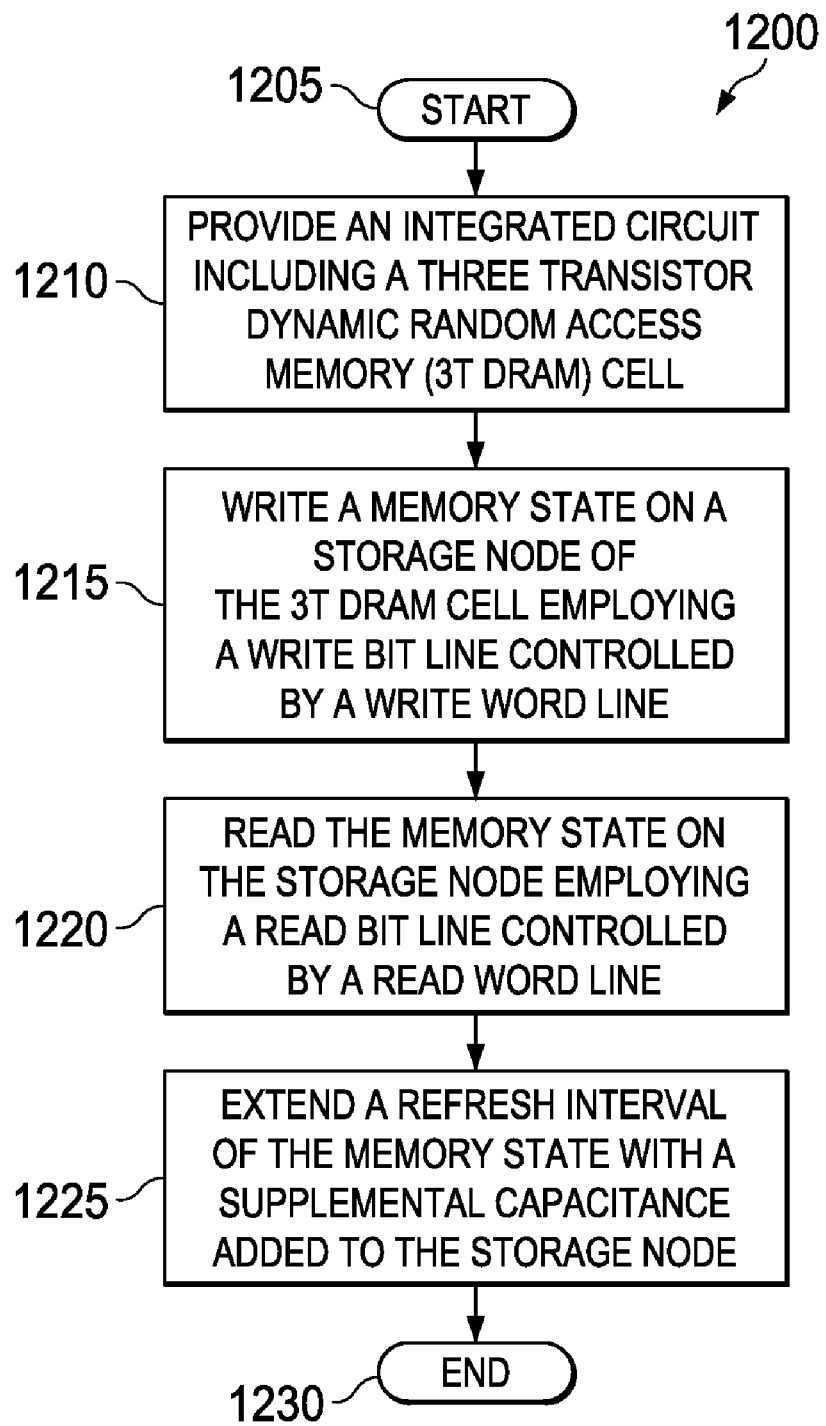
FIG. 12 illustrates a flow diagram of an embodiment of a method of operating an integrated circuit including a 3T DRAM cell constructed according to the principles of the present disclosure.

FIG. 12 illustrates a flow diagram of an embodiment of a method 1200 of operating an integrated circuit including a three transistor dynamic random access memory (3T DRAM) cell constructed according to the principles of the present disclosure. The method 1200 starts in a step 1205, and the integrated circuit with the 3T DRAM cell is provided in a step 1210. Then, in a step 1215, a memory state is written on a storage node of the 3T DRAM cell employing a write bit line controlled by a write word line, and the memory state on the storage node is read employing a read bit line controlled by a read word line, in a step 1220. A refresh interval of the memory state is extended with a supplemental capacitance added to the storage node, in a step 1225.

In one embodiment, the read bit line and the write bit line are a common read/write bit line. In another embodiment, the supplemental capacitance is formed between the storage node and a current sinking voltage. In yet another embodiment, the supplemental capacitance is provided by one selected from the group consisting of an overlap capacitance between two metallization levels and an edge capacitance in at least one metallization level. In still another embodiment, an electrical connection between metallization levels is used to provide at least a portion of the supplemental capacitance.

In a further embodiment, at least a portion of the supplemental capacitance is supplied by an intrinsic metallization level inherent in the 3T DRAM cell. In a yet further embodiment, at least a portion of the supplemental capacitance is supplied by an extrinsic metallization level added to the 3T DRAM cell. Additionally, the extrinsic metallization level may use up to substantially a full footprint of the 3T DRAM cell to provide supplemental capacitance. In a still further embodiment, the supplemental capacitance is provided by a metal-insulator-metal capacitor wherein the metal-insulator-metal capacitor may employ a high-dielectric coefficient insulator. The method 1200 ends in a step 1230.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. An integrated circuit including a three transistor dynamic random access memory (3T DRAM) cell, comprising:
   a first transistor having a first control element connected as a storage node;
   a second transistor connected between the first transistor and a read bit line having a second control element connected to a read word line;
   a third transistor connected between the storage node and a write bit line having a third control element connected to a write word line; and
   a supplemental capacitance connected to between the storage node and a current sinking voltage;
   wherein the read bit line and the write bit line are a common read/write bit line.

2. An integrated circuit including a three transistor dynamic random access memory (3T DRAM) cell, comprising:
   a first transistor having a first control element connected as a storage node;
   a second transistor connected between the first transistor and a read bit line having a second control element connected to a read word line;
   a third transistor connected between the storage node and a write bit line having a third control element connected to a write word line; and a supplemental capacitance connected to between the storage node and a current sinking voltage;
wherein at least a portion of the supplemental capacitance is supplied by an intrinsic metallization level inherent in the 3T DRAM cell.

3. An integrated circuit including a three transistor dynamic random access memory (3T DRAM) cell, comprising:
a first transistor having a first control element connected as a storage node;
a second transistor connected between the first transistor and a read bit line having a second control element connected to a read word line;
a third transistor connected between the storage node and a write bit line having a third control element connected to a write word line; and
a supplemental capacitance connected to between the storage node and a current sinking voltage;
wherein at least a portion of the supplemental capacitance is supplied by an extrinsic metallization level added to the 3T DRAM cell.

4. The integrated circuit as recited in claim 3 wherein the extrinsic metallization level uses substantially a full footprint of the 3T DRAM cell to provide at least a portion of the supplemental capacitance.

5. An integrated circuit including a three transistor dynamic random access memory (3T DRAM) cell, comprising:
a first transistor having a first control element connected as a storage node;
a second transistor connected between the first transistor and a read bit line having a second control element connected to a read word line;
a third transistor connected between the storage node and a write bit line having a third control element connected to a write word line; and
a supplemental capacitance connected between the storage node and a current sinking voltage;
wherein the supplemental capacitance is provided by one selected from the group consisting of:
an overlap capacitance between two metallization levels; and
an edge capacitance in at least one metallization level.

6. An integrated circuit including a three transistor dynamic random access memory (3T DRAM) cell, comprising:
a first transistor having a first control element connected as a storage node;
a second transistor connected between the first transistor and a read bit line having a second control element connected to a read word line;
a third transistor connected between the storage node and a write bit line having a third control element connected to a write word line; and
a supplemental capacitance connected to between the storage node and a current sinking voltage;
wherein the supplemental capacitance is provided by a metal-insulator-metal capacitor.

7. The integrated circuit as recited in claim 6 wherein the metal-insulator-metal capacitor employs a high-dielectric coefficient insulator.

8. A method of operating an integrated circuit including a three transistor dynamic random access memory (3T DRAM) cell, comprising:
writing a memory state on a storage node of the 3T DRAM cell employing a write bit line controlled by a write word line;
reading the memory state on the storage node employing a read bit line controlled by a read word line; and
extending a refresh interval of the memory state with a supplemental capacitance added to the storage node; the supplemental capacitance being connected between the storage node and a current sinking voltage.

9. The method as recited in claim 8 wherein the read bit line and the write bit line are a common read/write bit line.

10. The method as recited in claim 8 wherein the supplemental capacitance is formed between the storage node and a current sinking voltage.

11. The method as recited in claim 8 wherein at least a portion of the supplemental capacitance is supplied by an intrinsic metallization level inherent in the 3T DRAM cell.

12. The method as recited in claim 8 wherein at least a portion of the supplemental capacitance is supplied by an extrinsic metallization level added to the 3T DRAM cell.

13. The method as recited in claim 12 wherein the extrinsic metallization level uses substantially a full footprint of the 3T DRAM cell to provide at least a portion of the supplemental capacitance.

14. The method as recited in claim 8 wherein the supplemental capacitance is provided by one selected from the group consisting of:
an overlap capacitance between two metallization levels; and
an edge capacitance in at least one metallization level.

15. The method as recited in claim 8 wherein an electrical connection between metallization levels is used to provide at least a portion of the supplemental capacitance.

16. The method as recited in claim 8 wherein the supplemental capacitance is provided by a metal-insulator-metal capacitor.

17. The method as recited in claim 16 wherein the metal-insulator-metal capacitor employs a high-dielectric coefficient insulator.

* * * * *